United States Patent [19]

Yasuda

[11] Patent Number: 5,101,205
[45] Date of Patent: Mar. 31, 1992

[54] A/D CONVERTER INCLUDING ERROR CORRECTION FOR A LOCAL D/A CONVERTER

[75] Inventor: Akira Yasuda, Kawasaki, Japan

[73] Assignee: Kabushiki Kaisha Toshiba, Kawasaki, Japan

[21] Appl. No.: 645,391

[22] Filed: Jan. 24, 1991

[30] Foreign Application Priority Data

Jan. 24, 1990 [JP] Japan .................. 2-12681

[51] Int. Cl.⁵ ............................ H03M 3/00
[52] U.S. Cl. .................. 341/155; 341/143; 341/118; 375/27
[58] Field of Search ......... 341/76, 77, 106, 118, 341/143, 155; 375/27, 34; 335 6/37.8

[56] References Cited

U.S. PATENT DOCUMENTS

| 4,107,669 | 8/1978 | Tewksbury | 341/143 |
| 4,540,973 | 9/1985 | Grallert | 341/106 X |
| 4,588,981 | 5/1986 | Senn | 341/143 |
| 4,706,261 | 11/1987 | Torre et al. | 375/27 |
| 4,746,902 | 5/1988 | Tol et al. | 341/118 |
| 4,772,821 | 9/1988 | Suzuki et al. | 341/155 |
| 4,852,125 | 7/1989 | Suzuki | 341/76 X |
| 4,862,169 | 8/1989 | Van Bavel | 341/143 |
| 4,937,577 | 6/1990 | Rich et al. | 341/143 |
| 4,977,403 | 12/1990 | Larson | 341/143 |
| 4,995,059 | 2/1991 | Ishikawa | 375/27 |

FOREIGN PATENT DOCUMENTS 1112822 5/1989 Japan .
1290316 11/1989 Japan .

Primary Examiner—Howard L. Williams
Attorney, Agent, or Firm—Oblon, Spivak, McClelland, Maier & Neustadt

[57] ABSTRACT

An A/D converter includes a subtracter for calculating a difference between an input signal and a feed-back signal, and outputting a differential signal, a local A/D converter for converting the differential signal into a first digital signal, a local D/A converter for converting the first digital signal into an analog signal, and outputting the analog signal, as a feedback signal, to the subtracter, an integrator inserted in a feedback loop constituted by the calculator, the local A/D converter, and the local D/A converter, a correcting circuit for correcting the first digital signal output from the local A/D converter so as to obtain a second digital signal corresponding to an analog signal output from the local D/A converter when the first digital signal is input thereto, and an output circuit for outputting the second digital signal, output from the correcting circuit, as an output signal.

17 Claims, 9 Drawing Sheets

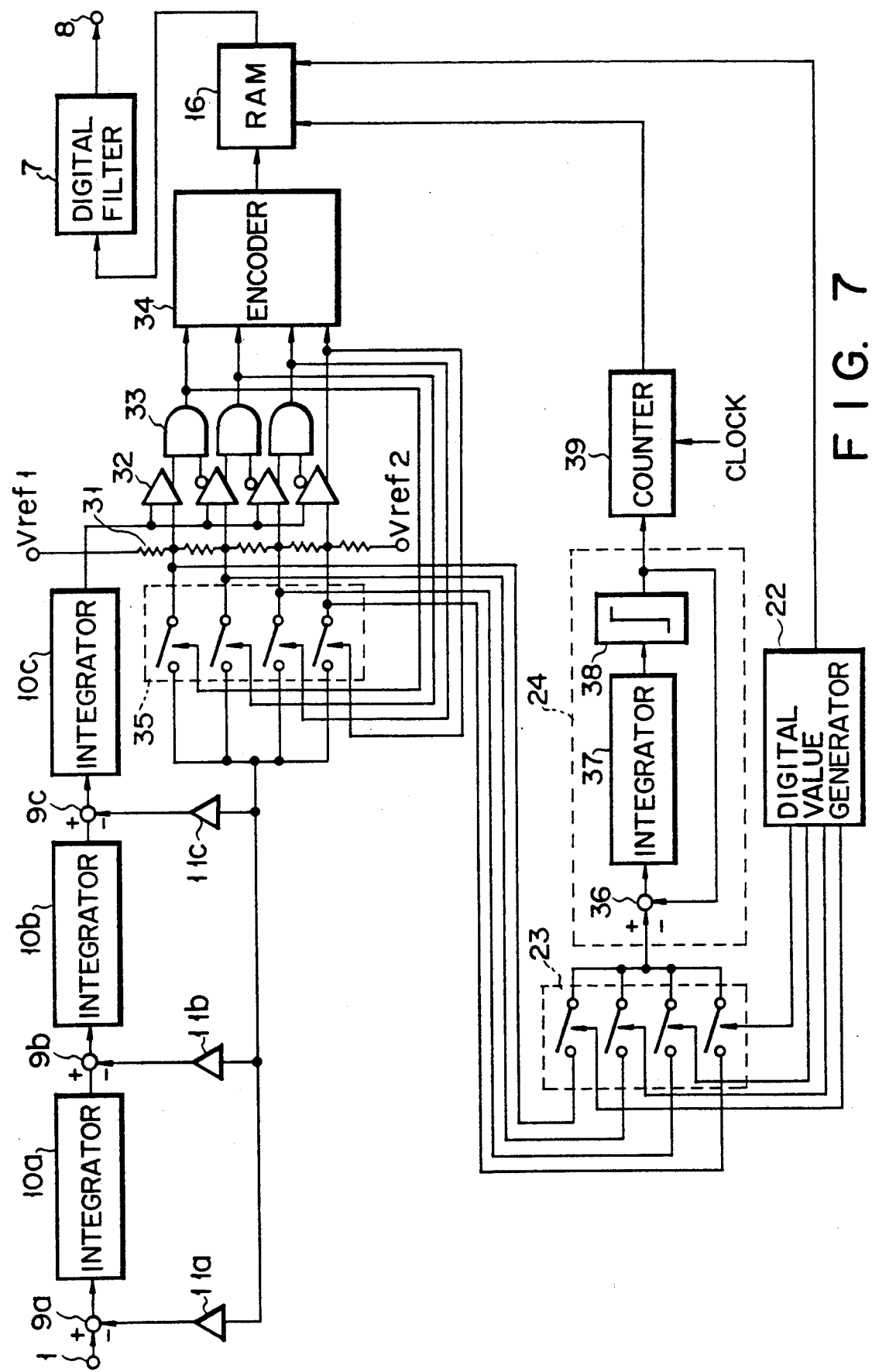
F I G. 7

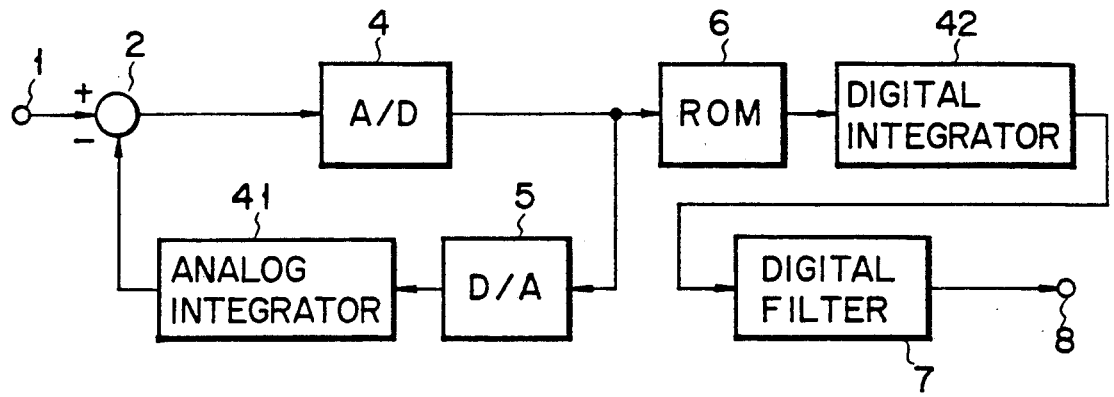
F I G. 8
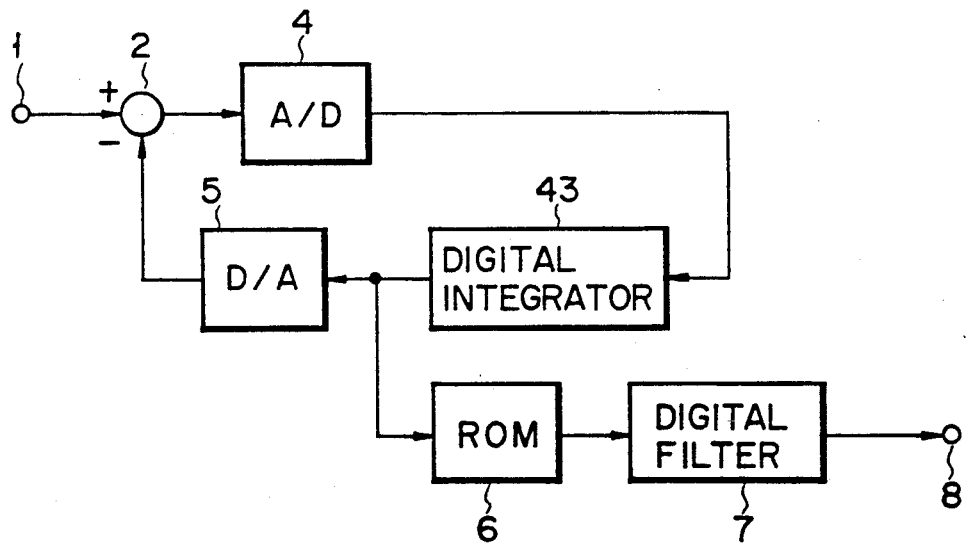
F I G. 9

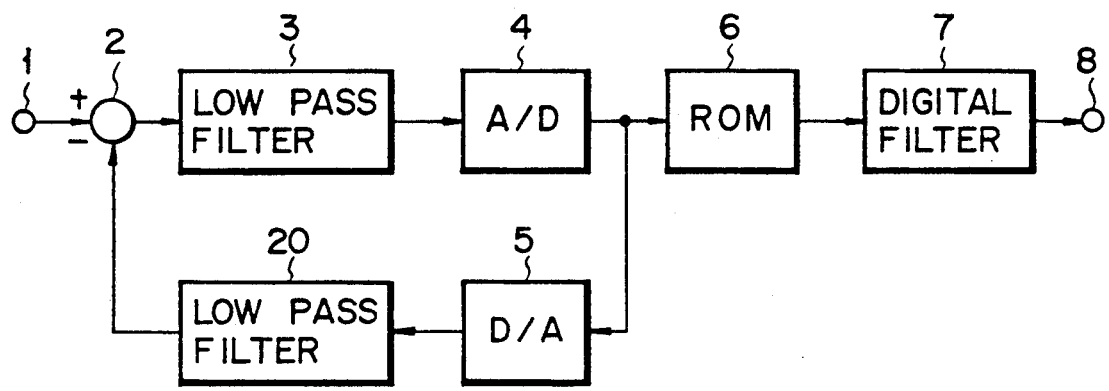
F I G. 12
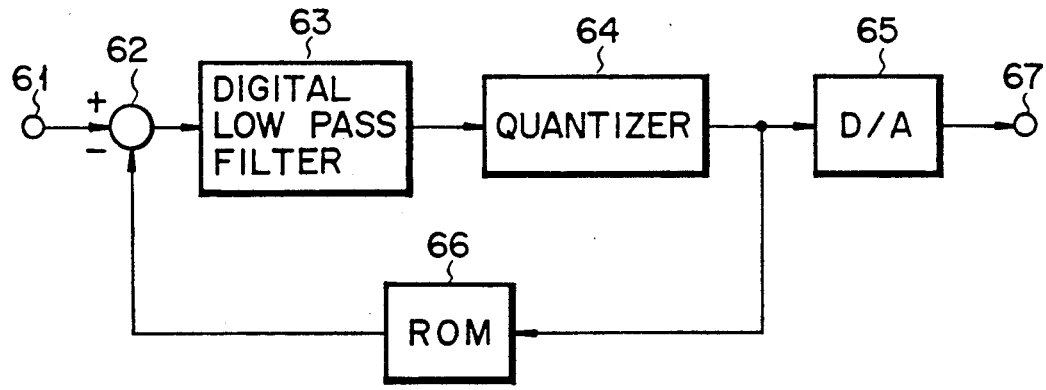
F I G. 13

A/D CONVERTER INCLUDING ERROR CORRECTION FOR A LOCAL D/A CONVERTER

BACKGROUND OF THE INVENTION

1. Field of the Invention

The present invention relates to an A/D converter and, more particularly, to a feedback type A/D converter such as a ΔΣ modulator type A/D converter or a Δ modulator type A/D converter.

2. Description of the Related Art

A ΔΣ modulator type A/D converter is known as a feedback type A/D converter. A conventional ΔΣ modulator type A/D converter is designed such that a differential signal based on a difference between an input signal supplied to an input terminal and a feedback signal as an output signal from a local D/A converter is generated by an adder, the differential signal is input to the local A/D converter through a low-pass filter for integration, and an A/D converter output is obtained from an output terminal.

One-bit converters may be used as a local A/D converter and a local D/A converter in principle. If, however, an integrator used as a low-pass filter is a three or more dimensional integrator, and if a converter having a one bit structure is used, an operation of a ΔΣ modulator becomes unstable. For this reason, a converter having a two or more bit structure is used. If a converter having a multiple bit structure is used, the quantization error is decreased, and the signal amplitude inside the integrator ca be reduced.

Assume that in the above-described conventional ΔΣ modulator type A/D converter, the local A/D converter and the local D/A converter are ideally operated. In this case, providing that an input to the input terminal is represented by u(z); an output to the output terminal, by y(z); a quantization error included in the local A/D converter, by e(z); and the transfer function of a low-pass filter 103, by H(z), the output y(z) is given by the following equation:

$$y(z) = \frac{H(z)}{1 + H(z)} u(z) + \frac{1}{1 + H(z)} e(z)$$

If $H(z) = 0$, $$y(z) = u(z) \frac{1}{H(z)} e(z)$$

Therefore, u(z) is obtained as the output y(z). If the low-pass filter serves as an integrator, since 1/H(z) in the above equations represents a high-pass filter characteristic, a low-frequency-band component of noise based on the quantization error e(z) can be reduced. When an input signal is to be sampled by the local A/D converter, if sampling is performed by using a frequency higher than the Nyquist frequency, i.e., oversampling is performed, so as to remove components other than those in a required band by means of a digital filter (not shown) connected to the output terminal of the A/D converter, the quantization error can be reduced, thus obtaining a desired S/N ratio. This principle is described in detail in Design Methodology for ΔΣ M BHGWATI P. AGRAWAL, KISHANSHENOI IEEE TRANSACTION on Communication, VOL. COM-31, No. 3, MARCH, 1983, pp. 360-370.

In the above-described ΔΣ modulator type A/D converter, an output signal from the local A/D converter is used as an output signal from the ΔΣ modulator. This signal is converted into an analog signal by the local D/A converter. The analog signal is then used as a feedback signal. Therefore, a conversion error in the local D/A converter appears as an output distortion. In order to solve such a problem, the conventional ΔΣ modulator type A/D converter uses a local D/A converter having precision higher than finally required precision thereof. That is, a D/A converter having a one bit structure is used. If, however, a three or more dimensional integrator is used as a low-pass filter, a D/A converter having a two or more bit structure, i.e., a multiple bit structure, is required, and a D/A converter having precision higher than the finally required precision must be used, in order to stabilize an operation of the ΔΣ modulator, reduce the quantization noise, or decrease the signal amplitude inside the integrator.

Assume, for example, that a D/A converter having a four bit structure is to be used. Even in this case, if precision of 16 bits is the finally required precision, a four-bit quantization level must be obtained with the precision of 16 bits or more. A D/A converter having such a multiple bit structure and high precision is difficult to realize. Even if it is possible to manufacture such a D/A converter, various steps such as trimming of a resistor for generating a reference voltage are required in the manufacturing process, resulting in a considerable increase in cost.

As described above, the conventional feedback type A/D converter such as a ΔΣ modulator type A/D converter requires a D/A converter having a multiple bit structure and precision higher than finally required precision as a local D/A converter. Such a multiple bit D/A converter having high conversion precision requires the steps such as trimming, and hence is difficult to realize. In addition, such a converter is expensive.

SUMMARY OF THE INVENTION

It is an object of the present invention to provide an A/D converter which can realize desired conversion precision even if a D/A converter having precision lower than finally required A/D conversion precision is used as a local D/A converter.

According to the present invention, in consideration of the fact that an A/D conversion error based on a conversion error of a local D/A converter is caused because an output digital value from a local A/D converter does not coincide with a digital value corresponding to an output analog value from the local D/A converter, there is provided an A/D converter wherein when the local D/A converter has a conversion error, the conversion error is corrected to reduce a difference between an output digital value from the local A/D converter and a digital value corresponding to an output analog value from the local D/A converter.

More specifically, according to the present invention, there is provided an A/D converter comprising a subtracter for generating a differential signal based on a difference between an input signal and a feedback signal, a local A/D converter for converting the differential signal or a signal obtained by processing the differential signal into a digital value, and outputting the digital value, a local D/A converter for converting the digital value output from the local A/D converter into an analog value so as to obtain a feedback signal, an integrator inserted in a feedback loop constituted by the subtracter, the local A/D converter, and the local D/A converter, and a correcting circuit for correcting the digital value output from the local A/D converter or the digital value input to the local D/A converter so as to obtain and output a digital value corresponding to an actual analog value output from the local D/A converter when the digital value is input thereto.

The correcting circuit is constituted by a ROM for storing calibration data, e.g., a relationship between digital values input to the local D/A converter and digital values accurately corresponding to analog values output from the local D/A converter. Digital values accurately corresponding to various output analog values from the local D/A converter are stored at the respective addresses of the ROM. A digital value output from the local A/D converter is used as an address input to read out data from an address designated by the address input.

According to another aspect of the present invention, a ROM may be used to pre-store a digital value based on a difference between a output digital value from a local A/D converter and a digital value corresponding to an actual analog value output from a local D/A converter when the output digital value is input thereto, so that the digital value based on the difference, which is stored at an address designated by the output digital value from the local A/D converter, is read out from the ROM, and the digital value is added to the output digital value from the local A/D converter, thus obtaining an A/D conversion output.

According to still another aspect of the present invention, there is provided a self-calibration type A/D converter comprising a measuring circuit for measuring a difference between an output digital value from a local A/D converter and a digital value corresponding to an actual analog value output from a local D/A converter when the digital value is input thereto, and a correcting circuit for correcting the output digital value from the local A/D converter on the basis of the data of the difference so as to obtain a digital value corresponding to an actual analog value output from the D/A converter when the digital value is input thereto. In this case, a RAM is used for the correcting circuit in place of the ROM, and the contents of the RAM are updated at any time to eliminate the difference.

Since an output digital value from the A/D converter of the present invention is corrected to be a digital value corresponding to an analog value output from the local D/A converter when the digital value is actually input thereto, an A/D conversion error caused by a conversion error of the local D/A converter is corrected. Therefore, by sufficiently increasing this correction precision, the A/D conversion precision becomes higher than the precision of the local D/A converter. In this case, since a tolerance of a conversion error of the local D/A converter is increased, a multiple bit D/A converter can be used without trimming in the manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a block diagram showing the seventh embodiment of the present invention wherein the sixth embodiment is made more practical;

FIG. 8 is a block diagram showing a $\Delta$ modulator type A/D converter according to the eighth embodiment of the present invention;

FIG. 9 is a block diagram showing a $\Delta$ modulator type A/D according to the ninth embodiment of the present invention;

FIG. 12 is a block diagram showing a prediction-noise-shaping type A/D converter according to the twelfth embodiment of the present invention; and FIG. 13 is a block diagram showing an embodiment wherein the present invention is applied to a $\Delta\Sigma$ modulator type D/A converter.

DETAILED DESCRIPTION OF THE PREFERRED EMBODIMENTS

Figure 1:
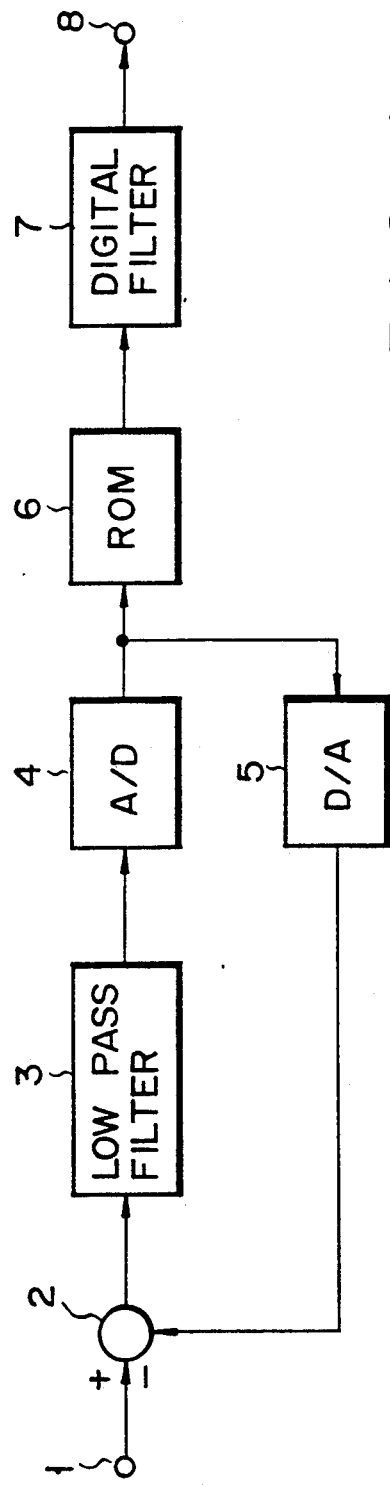
FIG. 1 is a block diagram showing a $\Delta\Sigma$ modulator type A/D converter according to the first embodiment of the present invention.

In an embodiment shown in FIG. 1, an analog input signal supplied to an input terminal 1 is supplied to the addition input terminal of a subtracter 2. An output signal from the subtracter 2 is input to a local A/D converter 4 through a low-pass filter 3 for integration. An output signal from the local A/D converter 4 is converted into an analog input signal by a local D/A converter 5. The analog signal is then supplied, as a feedback signal, to the subtraction input terminal of the subtracter 2. A $\Delta\Sigma$ modulator is constituted by the subtracter 2, the low-pass filter 3, the local A/D converter 4, and the local D/A converter 5.

The output signal from the local A/D converter is supplied, as an address input, to a ROM (read-only memory) 6. The ROM 6 is used to correct an output digital value (P) from the local A/D converter 4 so as to obtain and output a digital value (Q) corresponding to an actual analog value output from the local D/A converter 5 when the digital value P is input thereto. For this purpose, the ROM 6 stores digital values Q measured in advance and corresponding to various digital values P at addresses designated by the digital values P. More specifically, the ROM 6 stores a look-up table having the various output digital values P from the local A/D converter 4 and the digital values Q measured in advance in correspondence with the digital values P. In other words, the digital value P output from the A/D converter 4 is converted into address data by a digital value/address converter (not shown) and supplied to the ROM 6 to access the corresponding address thereof. The following tables 1 and 2 show two kinds of look-up table, respectively.

TABLE 1

| Input digital values (address) | True output of D/A converter |
|---|---|
| 0 | 0.0001 |
| 1 | 1.002 |
| 2 | 1.998 |
| . | . |
| N | . |

TABLE 2

| Input digital values (address) | Conversion error of D/A converter |
|---|---|
| 0 | 0.00001 |
| 1 | 0.00003 |
| 2 | −0.00002 |
| . | . |
| N | . |

The precision of the digital values Q is preferably higher than target A/D conversion precision.

The digital value Q stored at an address designated by the digital value P output from the local A/D converter 4 is read out from the ROM 6 and is input to a digital filter 7. The digital filter 7 removes unnecessary components, produced by over-sampling in the local A/D converter 4, from the output from the ROM 6, and transmits a final A/D conversion output to an output terminal 8.

In the A/D converter having the above-described arrangement, an error caused by a conversion error of the local D/A converter 5 is removed from an output digital value from the local A/D converter by the lookup table of the ROM 6. Therefore, an A/D conversion output with very high precision is obtained from the output terminal 8.

Figure 2A:
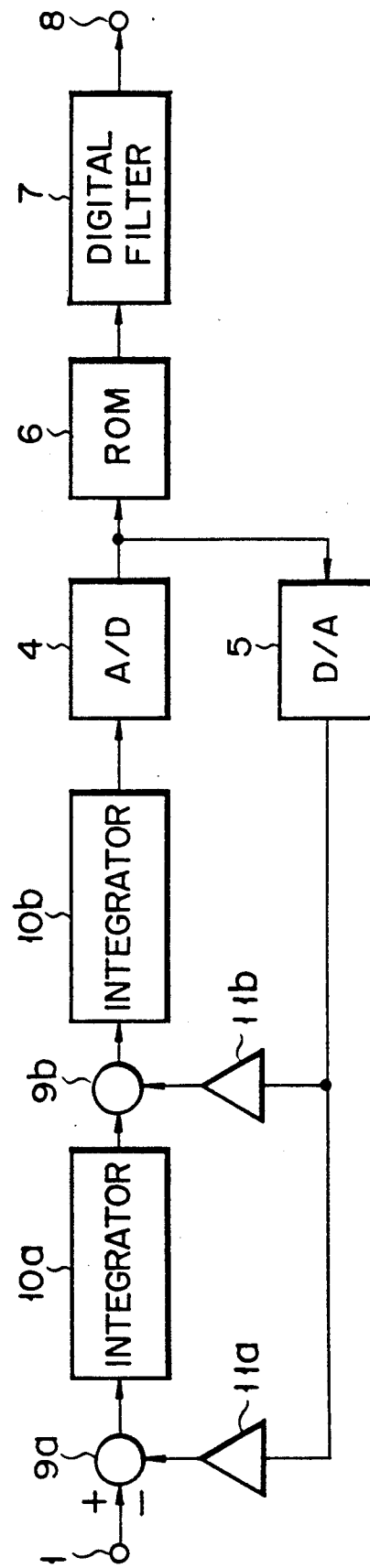
FIG. 2A is a block diagram showing a two dimensional $\Delta\Sigma$ modulator type A/D converter according to the second embodiment of the present invention.

In a ΔΣ modulator type A/D converter according to the second embodiment shown in FIG. 2A, the subtracter 2 and the low-pass filter 3 in the first embodiment are replaced with subtracters 9a and 9b, integrators 10a and 10b, and multipliers 11a and 11b, and a two dimensional ΘΣ modulator is constituted by these components, a local A/D converter 4, and a local D/A converter 5. More specifically, an input terminal 1 is connected to the local A/D converter 4 through the subtracter 9a, the integrator 10a, the subtracter 9b, and the integrator 10b. The output terminal of the D/A converter 5 is connected to the negative input terminals of the subtracters 9a and 9b through the multipliers 11a and 11b. Similar to the above embodiment, in this embodiment, an output signal from the local A/D converter 4 is corrected by a look-up table stored in the ROM 6, and is subsequently supplied to an output terminal 8 through a digital filter 7.

Figure 2B:
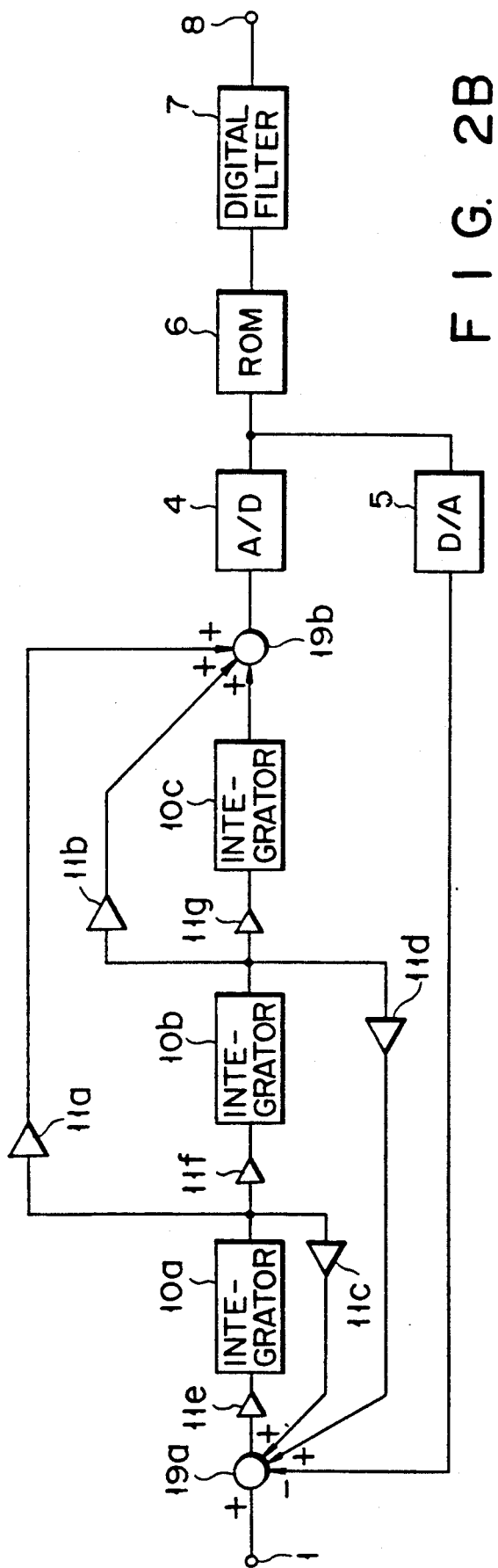
FIG. 2B is a block diagram showing a three dimensional $\Delta\Sigma$ modulator type A/D converter according to a modification of FIG. 2A.

According to a modification of FIG. 2A as shown in FIG. 2B, an input terminal 1 is connected to a local A/D converter 4 through a subtracter 19a, a multiplier 11e, an integrator 10a, a multiplier 11f, a integrator 10b, a multiplier 11g, an integrator 10c, and a subtracter 19b. The output terminals of the integrators 10a and 10b are connected to the subtracter 19b through multipliers 11a and 12b, respectively, and also to the subtracter 19a through multipliers 11c and 11d, respectively. The output terminal of the D/A converter 5 is connected to the negative input terminal of the subtracters 19a. In this modification, the output of the D/A converter 5 is not supplied directly to the integrator, but to the A/D converter 4 and the subtracter after the output of the integrator has been weighted.

In the A/D converters of FIG. 2A and 2B, an output signal from the local A/D converter 4 is corrected by a look-up table stored in the ROM 6, and is subsequently supplied to an output terminal 8 through a digital filter 7.

Figure 3A:
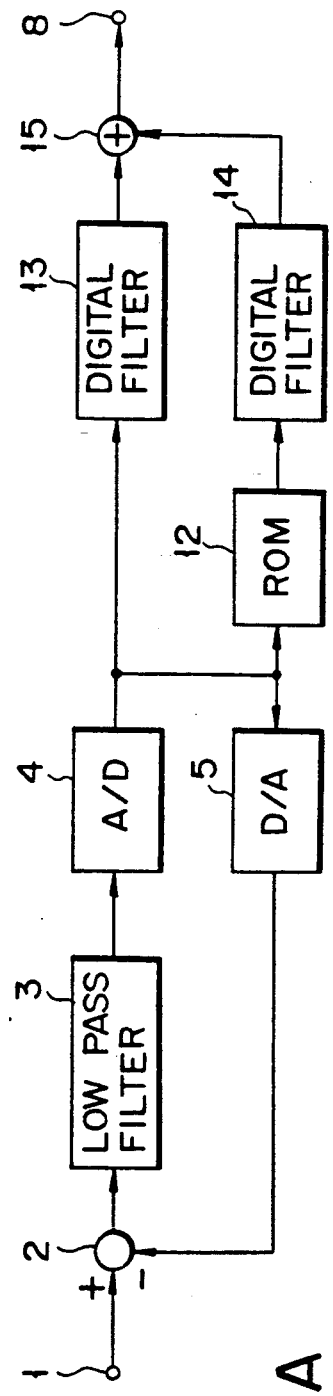
FIG. 3A is a block diagram showing a $\Delta\Sigma$ modulator type A/D converter according to the third embodiment of the present invention.

In a ΔΣ modulator type A/D converter according to the third embodiment shown in FIG. 3A, an output signal from a local A/D converter 4 is input to a ROM 12 and a digital filter 13. An output signal from the ROM 12 is input to a digital filter 14. Output signals from the digital filters 13 and 14 are added together by an adder 15, and the addition result is supplied, as an A/D conversion output, to an output terminal 8.

The ROM 12 prestores a digital value a-b as a difference between an output digital value a from the local A/D converter 4 and a digital value b corresponding to an actual analog value output from the local D/A converter 5 when the digital value a is input thereto. The digital value a-b stored at an address designated by the digital value a output from the local A/D converter 4 is read out from the ROM 12 and is input to the digital filter 14. The digital filter 14 removes unnecessary components, produced by over-sampling in the local A/D converter 4, from the output from the ROM 12. Similarly, the digital filter 13 removes unnecessary components, produced by over-sampling, from the output from the local A/D converter 4. When output signals from the digital filters 13 and 14 are added together by the adder 15, an error caused by a conversion error of the local D/A converter 5 can be removed from the output digital value from the local A/D converter 5. As a result, an A/D conversion output with very high precision can be obtained from the output terminal 8.

As described above, according to the third embodiment, an output signal from the local A/D converter 4 and an error signal based on a conversion error of the local D/A converter 5 are respectively input to the digital filters 13 and 14. Thereafter, these signals are synthesized by the adder 15 to obtain a final A/D conversion output. With this operation, the number of bits of each of input signals to the digital filters 13 and 14 can be set to be smaller than that of each digital filter 7 in the first and second embodiments. Since the circuit size of each of the digital filters 13 and 14 is smaller than that of the digital filter 7, an A/D converter having a smaller chip area can be formed.

Figure 3B:
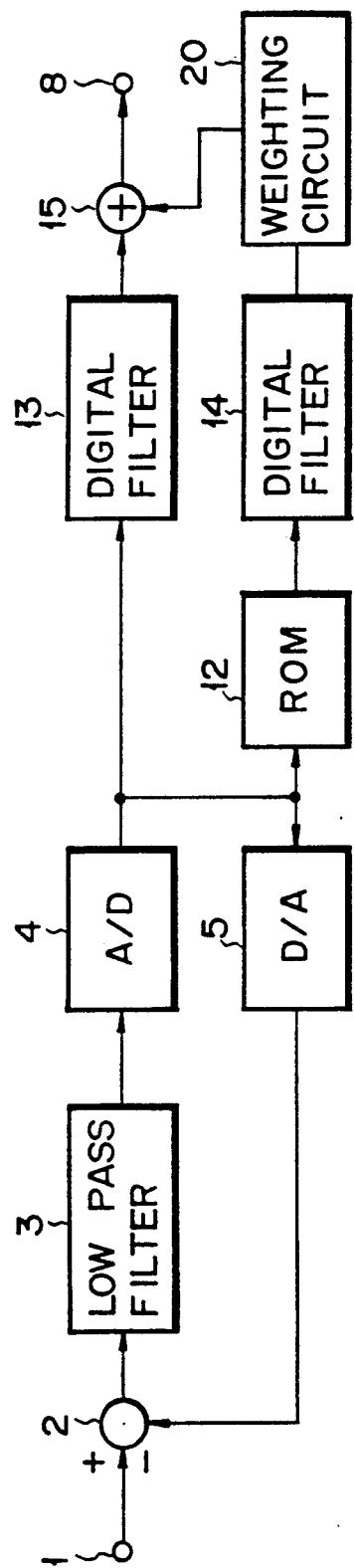
FIG. 3B is a block diagram showing a $\Delta\Sigma$ modulator type A/D converter according to a modification of FIG. 3A.

In a modification of FIG. 3A as shown in FIG. 3B, a weighting circuit for shifting the position of bits is connected between the digital filter 14 and the adder 15.

According to the A/D converter of FIG. 3, the following table 3 is provided in the ROM 12.

TABLE 3

| Input digital values (address) | Conversion error of D/A converter |
|---|---|
| 0 | 1 |
| 1 | 3 |
| 2 | −2 |
| . | . |
| . | . |
| N | . |

The table 3 is formed by omitting o from the table 2. When this table 3 is used, the output of the digital filter 14 is weighted by, for example, the shifting of bits before the outputs of the digital filter 13 and 14 are added together.

Figure 4:
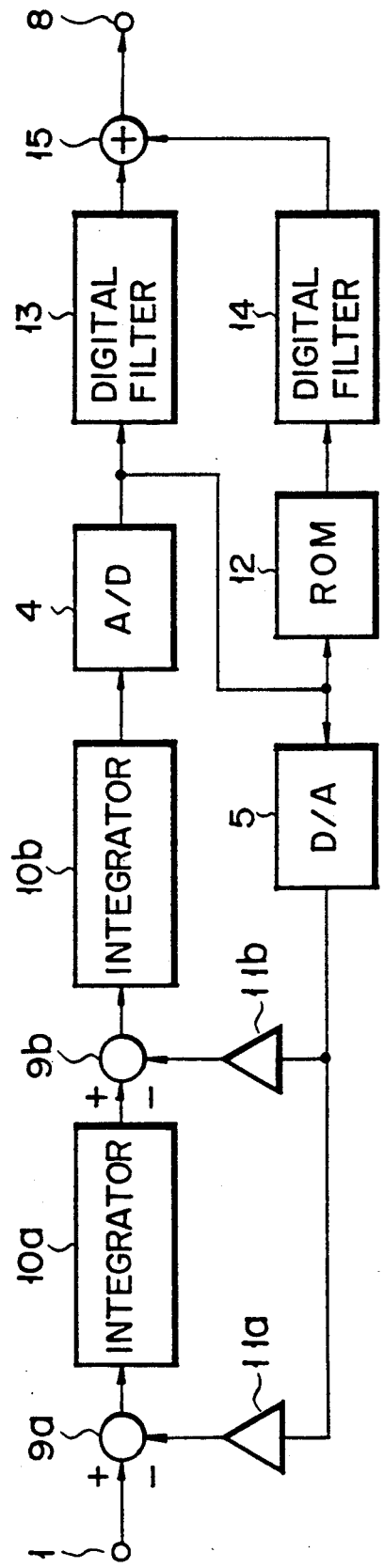
FIG. 4 is a block diagram showing a two dimensional CDCS modulator type A/D converter according to the fourth embodiment of the present invention.

In a $\Delta\Sigma$ modulator type A/D converter according to the fourth embodiment shown in FIG. 4, similar to the second embodiment, the $\Delta\Sigma$ modulator in the third embodiment is replaced with a two dimensional $\Delta\Sigma$ type modulator constituted by subtracters $9a$ and $9b$, integrators $10a$ and $10b$, and multipliers $11a$ and $11b$.

Figure 5:
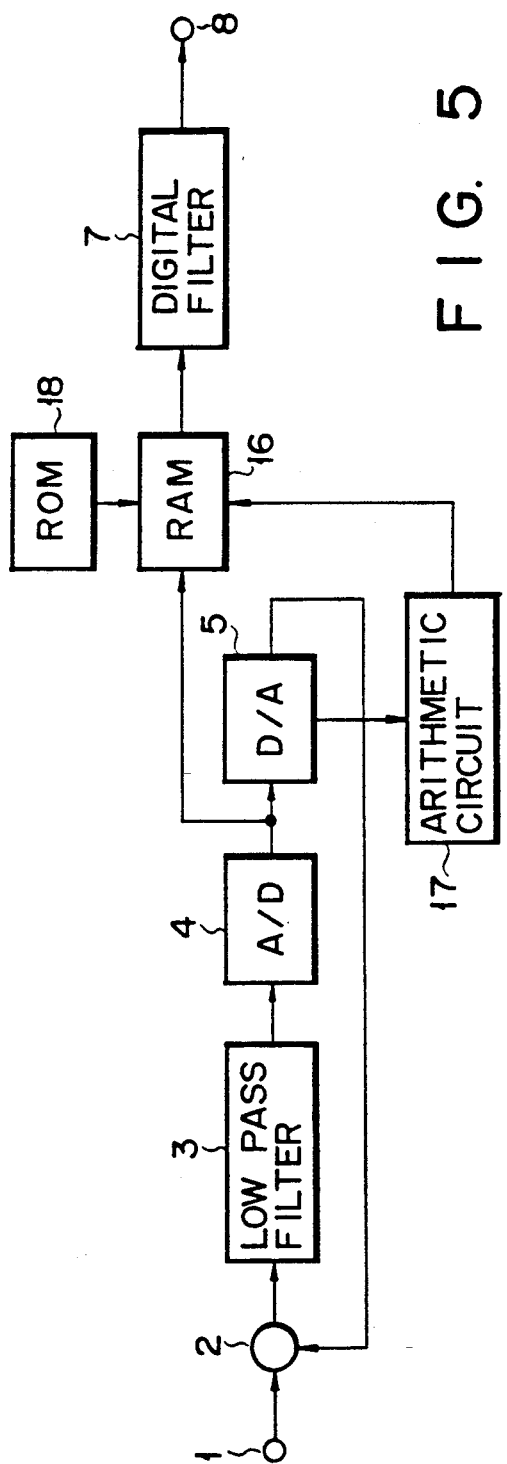
FIG. 5 is a block diagram showing a self-calibration type $\Delta\Sigma$ modulator type A/D converter according to the fifth embodiment of the present invention.

In a $\Delta\Sigma$ modulator type A/D converter of a self-calibration scheme according to the fifth embodiment shown in FIG. 5, an output signal from a local A/D converter 4 is input to a RAM (random access memory) 16. Similar to the ROMs 6 in the first and second embodiments, the RAM 16 serves to correct an output digital value P from the local A/D converter 4 so as to obtain and output a digital value Q corresponding to an actual analog value output from a local D/A converter 5 when the digital value P is input thereto. The digital value Q corresponding to the digital value P is written in the RAM 16 by an arithmetic circuit 17. The digital value Q stored at an address designated by the output digital value P from the local A/D converter 4 is read out from the RAM 16 and is input to a digital filter 7. The digital filter 7 removes unnecessary components, produced by over-sampling in the local A/D converter 4, from the output from the RAM 16, and supplies a final A/D conversion output to an output terminal 8.

The arithmetic circuit 17 measures a conversion error of the local D/A converter 5 at an time and writes a digital value b in the RAM 16 in accordance with the conversion error. The digital value Q stored at an address designated by the output digital value P from the local A/D converter 4 is read out from the RAM 16 and is input to the digital filter 7. The digital filter 7 removes unnecessary components, produced by over-sampling in the local A/D converter 4, from an output from a ROM 18, and supplies a final A/D conversion output to the output terminal 8. Since a value corresponding to an ideal output from the local D/A converter 5 is read out from the ROM 18 and is written, as an initial value, in the RAM 16, the occurrence of conversion errors immediately after the start of a conversion operation is reduced.

According to this embodiment, an error of the A/D converter 4 due to changes in temperature, changes in quality over years, and the like can be corrected. In addition, since the contents of the RAM 16 are automatically corrected, high conversion precision can be obtained without writing the digital values Q in a ROM in advance as in the case wherein the ROM 16 is used.

Figure 6:
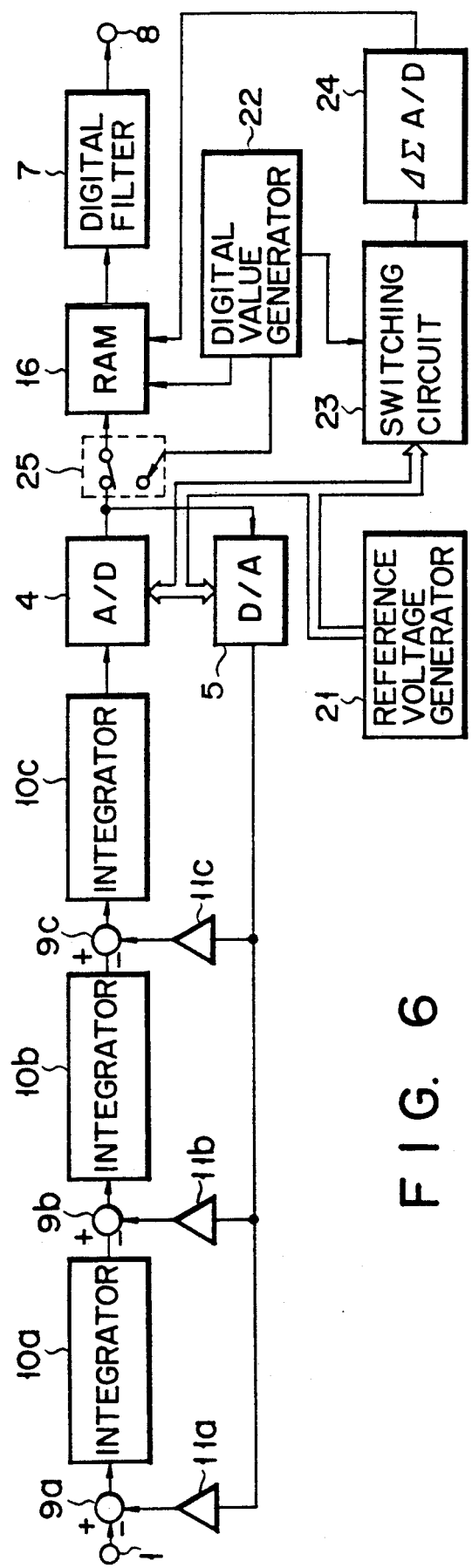
FIG. 6 is a block diagram showing the sixth embodiment of the present invention wherein the fifth embodiment is applied to a three dimensional $\Delta$ modulator type A/D converter.

In a $\Delta\Sigma$ modulator type A/D converter according to the sixth embodiment shown in FIG. 6 wherein the fifth embodiment is made more practical, a three dimensional modulator is constituted by subtracters $9a$ to $9c$, integrators $10a$ to $10c$, multipliers $11a$ to $11c$, a local A/D converter 4, and a local D/A converter 5. A plurality of reference voltages generated by a reference voltage generator 21 and used by the local A/D converter 4 and the local D/A converter 5 are switched by a switching circuit 23 in accordance with a digital value from a digital value generator 22. The resultant voltage is then converted into a digital value by a $\Delta\Sigma$ modulator type A/D converter 24 to generate a digital value to be written in a RAM 16. When the digital value output from the $\Delta\Sigma$ modulator type A/D converter 24 is written in the RAM 16, the address input terminal of the RAM 16 is switched from the output terminal of the local A/D converter 4 to the output terminal of the digital value generator 22. Such a writing operation with respect to the RAM 16 is performed at any time.

Since a conversion error of the local D/A converter 5 is caused by an error of a reference voltage generated by the reference voltage generator 21, an analog voltage output from the switching circuit 23 includes conversion error data of the local D/A converter 5. Therefore, when this data is processed by the $\Delta\Sigma$ modulator type A/D converter 24, a digital value, which corresponds to an actual analog value output from the local D/A converter 5 when an output digital value from the local A/D converter 4 is input to the local D/A converter 5, is written in the RAM 16.

In addition, according to this embodiment, since the reference voltage generator 21 is commonly used for the local A/D and D/A converters 4 and 5, an input analog voltage value to the local A/D converter 4 perfectly coincides with an output analog voltage value from the local D/A converter 5. This prevents an increase in quantization noise in the local A/D and D/A converters 4 and 5 and can minimize a decrease in S/N ratio.

In a $\Delta\Sigma$ modulator type A/D converter according to the seventh embodiment shown in FIG. 7 wherein the sixth embodiment is made more practical, resistors 31 connected in series with each other between two reference voltages Vref1 and Vref2 constitute the reference voltage generator 21 in FIG. 6, and the local A/D converter 4 in FIG. 6 is constituted by a plurality of comparators 32 for comparing a plurality of reference voltages obtained by these resistors 31 with input signal voltages supplied through subtracters $9a$ to $9c$, integrators $10a$ to $10c$, and multipliers $11a$ to $11c$, a plurality of AND gates 33 and an encoder 34 arranged on the output side of the comparators 32.

When a switching circuit 35 connected between the nodes of the resistors 31 and the common input line of the multipliers $11a$ to $11c$ is switched in accordance with outputs from the AND gates 33, the switching circuit 35 generates a analog voltage value corresponding an output digital value from a local A/D converter 4. That is, the switching circuit 35 constitutes the local D/A converter 5 (FIG. 6) together with the resistors 31.

A subtracter 36, an integrator 37, and a comparator 38 constitute the $\Delta\Sigma$ modulator type A/D converter 24 in FIG. 6. This A/D converter 24 has a one bit structure. The pulse width or density of an output from the A/D converter 24 is changed in accordance with the DC component of an analog voltage input thereto through a switching circuit 23. Output digital values from this $\Delta\Sigma$ modulator type A/D converter 24 are added together and averaged by a counter 39 constituting a digital lowpass filter, and the average value is written at an address, of the RAM 16, designated by an output digital value from a digital value generator 22.

In a Δ modulator type A/D converter according to the eighth embodiment of the present invention shown in FIG. 8, an analog integrator 41 is inserted between the output terminal of a local D/A converter 5 and the subtraction input terminal of a subtracter 2. A Δ modulator is calibrated by the D/A converter 5 and the analog integrator 41. A digital integrator 42 is inserted between a ROM 6 and a digital filter 7. The ROM 6 is identical to the ROM 6 in each of the first and second embodiments.

A Δ modulator type A/D converter according to the ninth embodiment shown in FIG. 9 is different from the A/D converter shown in FIG. 8 in that a digital integrator 43 is inserted between the output terminal of a local A/D converter 4 and the input terminal of a local D/A converter 5. The digital integrator 43 can also have the function of the digital integrator 42 shown in FIG. 8.

Figure 10:
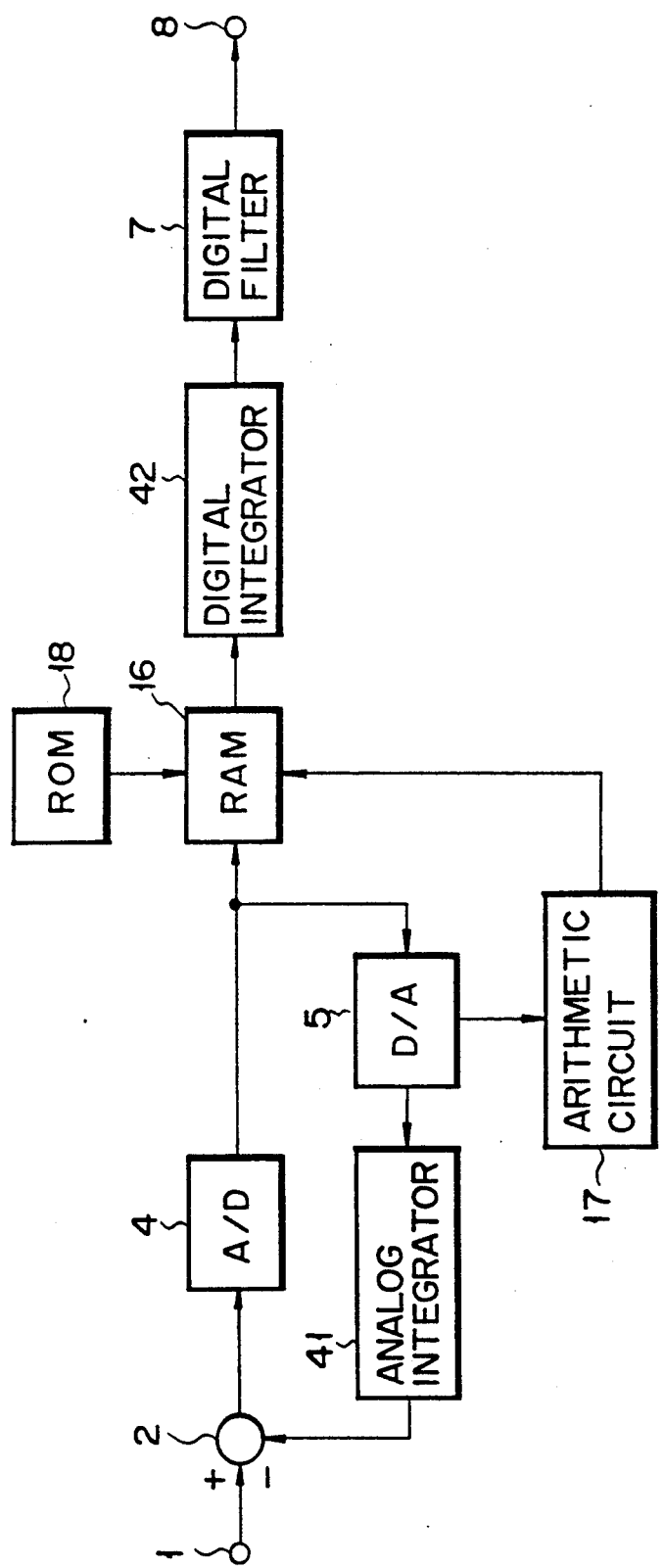
FIG. 10 is a block diagram showing a self-calibration type $\Delta$ modulator type A/D converter according to the tenth embodiment of the present invention.
Figure 11:
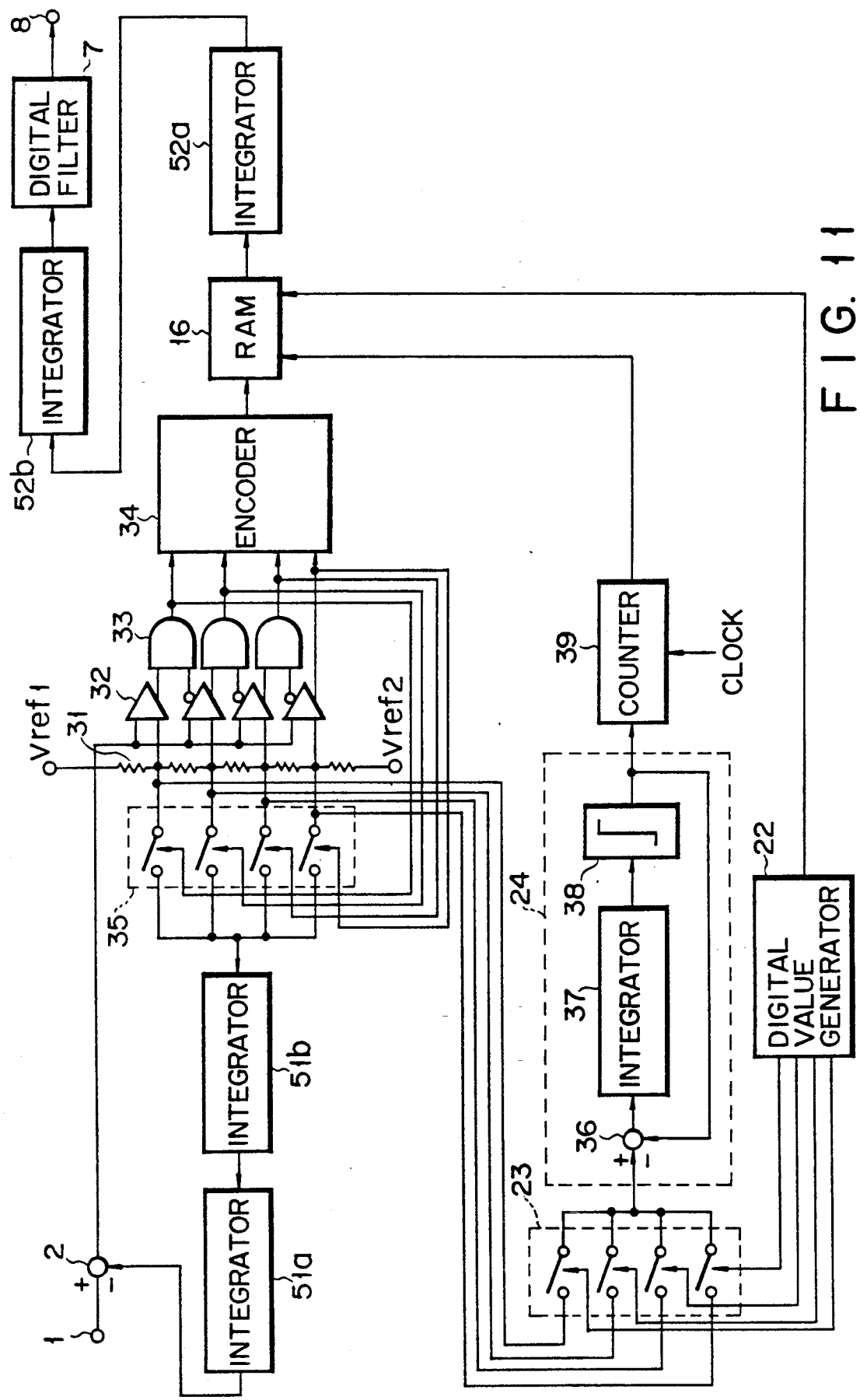
FIG. 11 is a block diagram showing the eleventh embodiment wherein the tenth embodiment is made more practical.

In a Δ modulator type A/D converter according to the tenth embodiment shown in FIG. 10, similar to the fifth embodiment, a RAM 16 is used in place of the ROM 6 in the eighth embodiment, and corrected data is written in the RAM 16 by an arithmetic circuit 17. A ROM 18 is used to write initial values in the RAM 16. In a Δ modulator type A/D converter according to the eleventh embodiment shown in FIG. 11 wherein the tenth embodiment is made more practical, the arrangement is the same as that of the embodiment shown in FIG. 7 except for two analog integrators 51a and 51b corresponding to the digital integrator 41 in FIG. 10, and two digital integrators 52a and 52b corresponding to the digital integrator 42 in FIG. 10. Therefore, the same reference numerals in FIG. 11 denote the same parts as in FIG. 7, and a detailed description thereof will be omitted.

FIG. 12 is a block diagram showing an A/D converter according to the twelfth embodiment of the present invention. In this embodiment, in addition to the low-pass filter inserted between the subtracter 2 and the local A/D converter 4 in FIG. 1, a low-pass filter 20 is inserted between a local D/A converter 5 and a subtracter 2. The low-pass filter 20 is constituted by an analog integrator. This arrangement is of a prediction-noise-shaping type A/D converter. Similar to the above embodiments, in this embodiment, an output from the local A/D converter 4 is corrected by a ROM 6 to obtain a value corresponding to an actual output value from the local D/A converter 5, and the obtained value is then supplied to an output terminal 8 through a digital filter 7.

In a ΔΣ modulator type D/A converter according to the thirteenth embodiment of the present invention shown in FIG. 13, a digital input signal provided to an input terminal 61 is supplied to the subtraction input terminal of a subtracter 62, and an output signal from the subtracter 62 is input to a digital low-pass filter 63 for integration. An output from the digital low-pass filter 63 is input to a quantizer 64 so that requantization is performed in accordance with the number of input bits of a local D/A converter 65. An output from the quantizer 64 is input to the local D/A converter 64 and is also fed back to the subtraction input terminal of the subtracter 62 through a ROM 66. An output from the local D/A converter 65 is supplied, as a D/A conversion output, to an output terminal 67. The ROM 66 is used to correct an output digital value (R) from the quantizer 64 so as to obtain and output a digital value (S) corresponding to an actual analog value output from the local D/A converter 65 when the digital value R is input thereto. The ROM 66 prestores digital value d accurately corresponding to the digital value R. The precision of the digital value S is preferably higher than target D/A conversion precision.

The digital value S stored at an address designated by the output digital value R from the quantizer 64 is read out from the ROM 66 and is fed back to the subtracter 62. With this operation, a digital value input to the local D/A converter 65 is corrected by an amount corresponding a predicted conversion error of the local D/A converter 65. Therefore, a D/A conversion output with very high precision can be obtained from the output terminal 67.

The present invention is not limited to the abovedescribed embodiments and can be applied to feedback type A/D converters of any number of dimensions and any types. In addition, local A/D and D/A converters to be used are not limited those in the embodiments described above. As a local A/D converter, for example, any one of the following A/D converters may be used: a sequential comparison type A/D converter, an integration type A/D converter, a parallel comparison type A/D converter, a series/parallel comparison type A/D converter, and a modulator type A/D converter. As a local D/A converter, for example, any one of the following D/A converters may be used: a weighted current type D/A converter, a current addition type D/A converter, an R-2R resistor ladder type D/A converter, and a ΔΣ modulator type D/A converter.

According to the present invention, an A/D conversion output is free from the influence of a conversion error of a local D/A converter, and hence A/D conversion can be performed with very high precision.

Even if, therefore, a D/A converter having a multiple bit structure, which is advantageous in terms of stability of an operation, quantization noise, and the signal amplitude inside an integrator, is used as a local D/A converter, trimming and the like need not be performed in the manufacturing process in order to increase the precision of the D/A converter itself, thereby realizing a cost reduction.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:
1. An A/D converter comprising:
calculating means for generating a differential signal corresponding to a difference between an input signal and a feedback signal;
local A/D-converting means for converting the differential signal into a first digital signal;
local D/A-converting means, connected to said local A/D-converting means, for converting the first digital signal into an analog signal, and outputting the analog signal, as the feedback signal, to said calculating means;
filter means inserted in at least one of a path between said calculating means and said local A/D-converting means, a path between said local A/D-convert- ing means and said local D/A-converting means, and a path between said local D/A-converting means and said calculating means;

correcting means for correcting the first digital signal output from said local A/D-converting means so as to obtain a second digital signal corresponding to the analog signal output from said local D/A-converting means when the first digital signal is input thereto; and output means for outputting the second digital signal, output from said correcting means, as an output signal.

2. A converter according to claim 1, wherein said correcting means includes storage means for storing a look-up table which is formed in accordance with a relationship between a plurality put values to said local D/A-converting means and a plurality of output values corresponding thereto.

3. A converter according to claim 1, wherein said filter means comprises an integration circuit, connected between said calculating means and said A/D-converting means, for integrating the differential signal, and said local A/D-converting means converts an integrated differential signal, output from said local A/D-converting means, into the first digital signal.

4. A converter according to claim 1, wherein said filter means comprises a plurality of integrators connected between said calculating means and said A/D-converting means, and said calculating means includes a subtracter for calculating a difference between the input signal and the feedback signal, and a subtracter for calculating a difference between an output signal from a given integrator of said plurality of integrators and the feedback signal, and outputting the differential signal to an integrator next to said given integrator.

5. A converter according to claim 1, wherein said filter means is an analog integration circuit connected between said calculating means and said D/A-converting means.

6. A converter according to claim 1, wherein said filter means comprises a digital integration circuit connected between a connection node of said correcting means and said D/A-converting means, and said A/D-converting means.

7. A converter according to claim 1, wherein said filter means comprises an analog integrator connected between said calculating means and said A/D-converting means, and an analog integrator connected between said calculating means and said D/A-converting means.

8. A converter according to claim 1, further comprising means for writing the second digital value corresponding to the first digital signal into said correcting means.

9. A converter according to claim 1, wherein said correcting means comprises a memory for storing the digital value, means for reading out the digital value stored in said memory as a second digital signal, and means for writing a digital value corresponding to the first digital signal into said memory.

10. A converter according to claim 1, wherein said correcting means comprises digital value generating means for generating a digital value, switching means for switching a plurality of reference voltages in accordance with the digital value output from said digital value generating means, $\Delta\Sigma$ modulator type A/D-converting means for converting the reference voltage, output from said switching means, into a digital value, and a RAM for storing the digital value output from said converting means.

11. A converter according to claim 1, wherein said filter means comprises a plurality of integrators connected between said calculating means and said A/D-converting means, and said calculating means includes a subtracter for calculating a difference between the input signal and the feedback signal, and a subtracter for calculating a difference between an output signal from a given integrator of said plurality of integrators and the feedback signal, and outputting the differential signal to an integrator next to said given integrator.

12. A converter according to claim 1, further comprising an additional digital filter means connected between said correcting means and said output means, and wherein said filter means comprises an analog integrator connected between said calculating means and said D/A-converting means, and said correcting means comprises a memory for storing the digital value, means for reading out the digital value stored in said memory as a second digital signal, and means for writing a digital value corresponding to the first digital signal into said memory.

13. An A/D converter comprising:

calculating means for calculating a difference between an input signal and a feedback signal, and outputting a differential signal;

local A/D-converting means for converting the differential signal into a first digital signal;

local D/A-converting means for converting the first digital signal, output from said A/D-converting means, into an analog signal, and outputting the analog signal, as the feedback signal, to said calculating means;

filter means inserted in at least one of a path between said calculating means and said local A/D-converting means, a path between said local A/D-converting means and said local D/A converting means, and a path between said local D/A-converting means and said calculating means;

error signal output means for estimating a difference between said first digital signal, output from said local A/D-converting means, and the analog signal output from said local D/A-converting means when the first digital signal is input thereto, and outputting an error signal based on the difference;

correcting means for correcting the first digital signal by using the error signal to obtain a second digital signal; and output means for outputting the second digital signal, obtained by said correcting means, as an output signal.

14. A converter according to claim 13, wherein said correcting means includes storage means for storing a look-up table which is formed in accordance with a relationship between a plurality of input values to said local D/A-converting means and a plurality of output values corresponding thereto.

15. A converter according to claim 13, wherein said filter means comprises an integration circuit, connected between said calculating means and said A/D-converting means, for integrating the differential signal, and said local A/D-converting means converts an integrated differential signal, output from said local A/D-converting means, into the digital signal.

16. A converter according to claim 13, wherein said filter means comprises a plurality of integrators connected between said calculating means and said A/D- converting means, and said calculating means includes a subtracter for calculating a difference between the input signal and the feedback signal, and a subtracter for calculating a difference between an output signal from a given integrator of said plurality of integrators and the feedback signal, and outputting the differential signal to an integrator next to said given integrator.

17. A converter according to claim 1, wherein said filter means comprises an integrator.

* * * * *